(12) United States Patent
Yoshida et al.

(10) Patent No.: US 9,937,688 B2
(45) Date of Patent: Apr. 10, 2018

(54) STRETCHED LAMINATED FILM FOR USE IN PIEZOELECTRIC POLYMER MATERIAL, AND MANUFACTURING METHOD THEREOF

(71) Applicants: TEIJIN LIMITED, Osaka-shi, Osaka (JP); A SCHOOL CORPORATION KANSAI UNIVERSITY, Suita-shi, Osaka (JP)

(72) Inventors: Tetsuo Yoshida, Gifu (JP); Yoshiro Tajitsu, Osaka (JP); Atsuko Kato, Gifu (JP); Tomoka Yoshimura, Gifu (JP)

(73) Assignees: TEIJIN LIMITED, Osaka (JP); A SCHOOL CORPORATION KANSAI UNIVERSITY, Osaka (JP)

( * ) Notice: Subject to any disclaimer, the term of this patent is extended or adjusted under 35 U.S.C. 154(b) by 20 days.

(21) Appl. No.: 15/036,076

(22) PCT Filed: Dec. 3, 2014

(86) PCT No.: PCT/JP2014/081934
§ 371 (c)(1),
(2) Date: May 12, 2016

(87) PCT Pub. No.: WO2015/083723
PCT Pub. Date: Jun. 11, 2015

(65) Prior Publication Data
US 2016/0263872 A1    Sep. 15, 2016

(30) Foreign Application Priority Data
Dec. 3, 2013    (JP) .................................. 2013-250287

(51) Int. Cl.
*B32B 27/08*    (2006.01)
*B32B 27/36*    (2006.01)
(Continued)

(52) U.S. Cl.
CPC .......... *B32B 27/08* (2013.01); *B29C 47/0004* (2013.01); *B29C 47/0021* (2013.01);
(Continued)

(58) Field of Classification Search
None
See application file for complete search history.

(56) References Cited

U.S. PATENT DOCUMENTS

2009/0169844 A1    7/2009    Yamamura et al.

FOREIGN PATENT DOCUMENTS

| JP | 58-78673 U | 5/1983 |
|---|---|---|
| JP | 59-115580 A | 7/1984 |

(Continued)

OTHER PUBLICATIONS

Yoshida, T. (JP 2011-243606 A), Dec. 2011 (JPP machine translation to English).*

(Continued)

*Primary Examiner* — David Sample
*Assistant Examiner* — Donald M Flores, Jr.
(74) *Attorney, Agent, or Firm* — Sughrue Mion, PLLC

(57) ABSTRACT

The object of the present invention is to provide a laminated film made of polylactic acids which is not prone to delamination while having excellent piezoelectric properties and a manufacturing method thereof. That is, the present invention is obtained by the stretched laminated film manufactured by a co-extrusion process for use in piezoelectric polymer materials, containing a layer (A) which has poly-L-lactic acid as the primary component and contains an impact modifier in the range of 0.1 to 10 mass % and a layer (B) which has poly-D-lactic acid as the primary component and contains an impact modifier in the range of 0.1 to 10 mass %.

6 Claims, 1 Drawing Sheet

(51) Int. Cl.
    *B32B 37/15*     (2006.01)
    *H01L 41/45*     (2013.01)
    *H01L 41/193*     (2006.01)
    *H01L 41/333*     (2013.01)
    *B29C 47/00*     (2006.01)
    *B29C 47/06*     (2006.01)
    *H01L 41/113*     (2006.01)
    *H01L 41/09*     (2006.01)
    *B29K 67/00*     (2006.01)

(52) U.S. Cl.
    CPC ............ *B29C 47/065* (2013.01); *B32B 27/36* (2013.01); *B32B 37/153* (2013.01); *H01L 41/193* (2013.01); *H01L 41/333* (2013.01); *H01L 41/45* (2013.01); *B29C 47/0066* (2013.01); *B29K 2067/046* (2013.01); *B32B 2307/20* (2013.01); *B32B 2307/516* (2013.01); *B32B 2307/72* (2013.01); *B32B 2457/00* (2013.01); *H01L 41/0986* (2013.01); *H01L 41/113* (2013.01)

(56) References Cited

FOREIGN PATENT DOCUMENTS

| | | | |
|---|---|---|---|
| JP | 59-222977 | A | 12/1984 |
| JP | 5-152638 | A | 6/1993 |
| JP | 2005-213376 | A | 8/2005 |
| JP | 2010-229393 | A | 10/2010 |
| JP | 2010229393 | A * | 10/2010 |
| JP | 2011-243606 | A | 12/2011 |
| JP | 2011243606 | A * | 12/2011 |
| JP | 2014-27038 | A | 2/2014 |
| WO | 2007/063864 | A1 | 6/2007 |

OTHER PUBLICATIONS

Yamamura, G. (JP 2010-229393 A), Oct. 2010 (JPP machine translation to English).*

International Search Report of PCT/JP2014/081934 dated Mar. 10, 2015.

Communication dated Sep. 29, 2017 from the State Intellectual Property Office of the P.R.C. in counterpart Chinese application No. 201480066182.0.

* cited by examiner

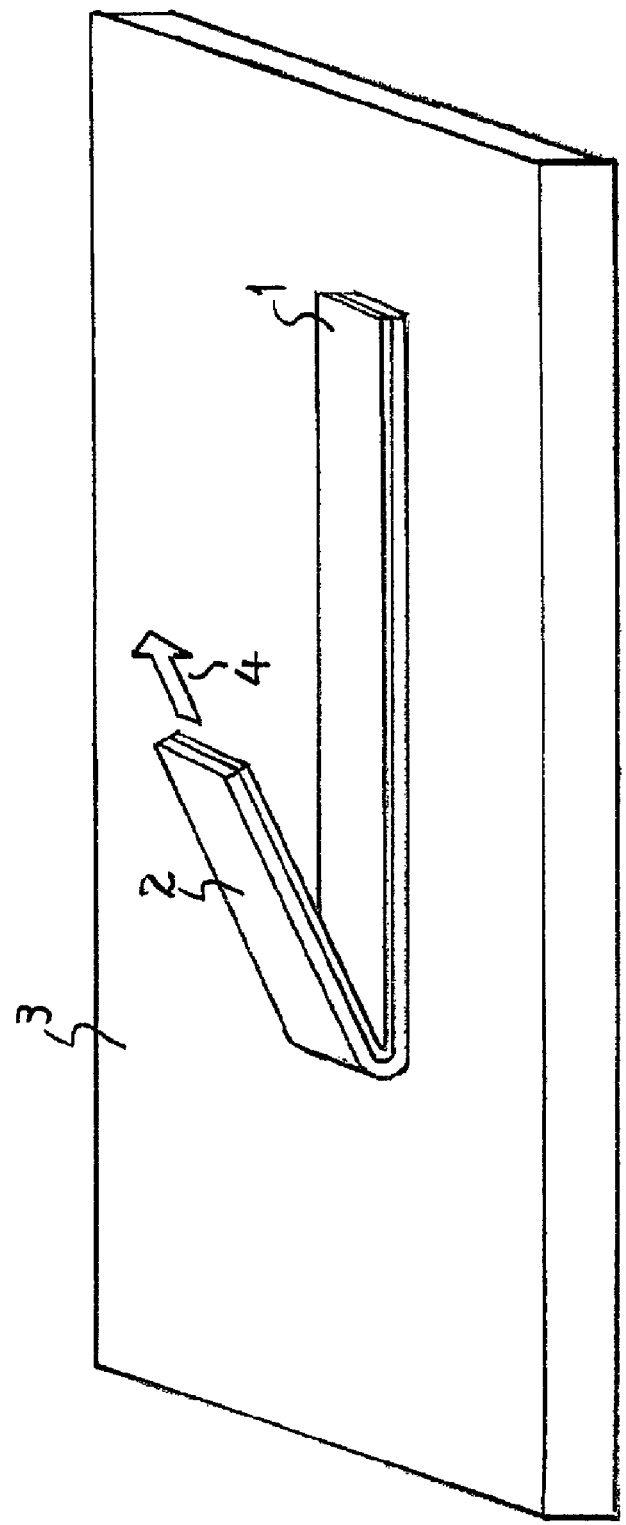

STRETCHED LAMINATED FILM FOR USE IN PIEZOELECTRIC POLYMER MATERIAL, AND MANUFACTURING METHOD THEREOF

TECHNICAL FIELD

The present invention relates to a laminated film for use in piezoelectric polymer materials and a manufacturing method thereof, and more particularly to a stretched laminated film for use in piezoelectric polymer materials with improvement in the problem of delamination and a manufacturing method thereof.

BACKGROUND ART

It is known that, when provided with conductive layers, stretched polylactic acid films can be used as piezoelectric polymer materials (Patent Documents 1 and 2). It is also known that, by laminating such piezoelectric polymer materials to form a bimorph or multimorph structure, thereby enhancing piezoelectric properties, it is made possible to use them as vibrating bodies of microphones, pickups, buzzers, speakers, optical switches, fans, etc. or as piezoelectric actuators (Patent Documents 3 to 5). However, Patent Document 3, in which piezoelectric polymer films are bonded together with an adhesive, suffers from complicated processing steps such as lamination etc. and from low productivity. A method of forming a bimorph structure by co-extrusion is known to solve these problems (Patent Document 6).

On the other hand, in the field of materials for presentation packaging of commercial products and the like, which is a wholly separate field from piezoelectric polymer materials, it is known to incorporate a poly(meth)acrylate-based resin in polylactic acid and to incorporate an impact modifier in it to provide a polylactic acid-based resin laminated sheet with excellent heat resistance, transparency, and impact resistance (Patent Document 7).

CITATION LIST

Patent Literature

[PTL 1] Japanese Unexamined Patent Application Publication No. 5-152638
[PTL 2] Japanese Unexamined Patent Application Publication No. 2005-213376
[PTL 3] Japanese Unexamined Patent Application Publication No. 59-115580
[PTL 4] Japanese Unexamined Patent Application Publication No. 59-222977
[PTL 5] Japanese Unexamined Utility Model (Registration) Application Publication No. 58-78673
[PTL 6] Japanese Unexamined Patent Application Publication No. 2011-243606
[PTL 7] WO 2007/063864

SUMMARY OF INVENTION

Technical Problem

When the present inventors practiced a method of forming a film by co-extrusion technology in order to form piezoelectric laminates having such as a bimorph structure as mentioned above, it was revealed that there is a new potential problem of the occurrence of delamination, which had not been the case in a conventional method via an adhesive. It should be noted that, in the case where lamination is conducted by co-extrusion, such a problem as delamination generally arises when polymers having different molecular structures are laminated, but it is a phenomenon that is not seen when polymers having exactly the same molecular structure are laminated and, of course, a phenomenon that is not observable in the case of polymers having the same molecular structure such as poly-L-lactic acid and poly-D-lactic acid.

Accordingly, an object of the present invention is to provide a laminated film made of polylactic acids which is not prone to delamination while having excellent piezoelectric properties and a manufacturing method thereof.

Another object of the present invention is to further provide a laminated film made of polylactic acids that is useful as a piezoelectric sensor and a manufacturing method thereof.

Solution to Problem

As a result of dedicated studies to solve the above problem, the present inventors have surprisingly found that, when an impact modifier which would have nothing to do with delamination is contained, a polylactic acid film that is not prone to delamination while having excellent piezoelectric properties was obtained, and have accomplished the present invention.

Thus, according to the present invention, laminated films for use in piezoelectric polymer materials, as found in (1) to (8) below, are provided to solve the above problem.

(1) A stretched laminated film obtained by a co-extrusion process for use in piezoelectric polymer materials, comprising a layer (A) containing poly-L-lactic acid as the primary component and an impact modifier in the range of 0.1 to 10 mass % and a layer (B) containing poly-D-lactic acid as the primary component and an impact modifier in the range of 0.1 to 10 mass %.
(2) The stretched laminated film for use in piezoelectric polymer materials according to (1), wherein the stretched laminated film has a piezoelectric constant d31 of less than 10 pC/N as determined by a forced vibration method.
(3) The stretched laminated film for use in piezoelectric polymer materials according to (1), wherein the ratio of the impact modifier contents of the layer (A) to the layer (B) (layer (A)/layer (B)) is in the range of 0.05 to 20.
(4) The stretched laminated film for use in piezoelectric polymer materials according to (1), wherein the stretched laminated film has a density of 1.22 to 1.27 g/cm$^3$.
(5) The stretched laminated film for use in piezoelectric polymer materials according to (1), wherein the stretched laminated film has a thickness of 250 μm or less.
(6) The stretched laminated film for use in piezoelectric polymer materials according to (1), wherein the stretched laminated film generates an output voltage of 1 mVp-p or more when displaced with the one end fixed.

In addition, the present invention includes the following methods for manufacturing of (7) and (8).
(7) A method for manufacturing a stretched laminated film for use in piezoelectric polymer materials, comprising steps of: melting a resin composition (A) for forming a layer (A), the resin composition (A) containing poly-L-lactic acid as the primary component and an impact modifier in the range of 0.1 to 10 mass %, and a resin composition (B) for forming a layer (B), the resin composition (B) containing poly-D-lactic acid as the primary component and an impact modifier in the range of 0.1 to 10 mass %, in separate extruders, respectively; laminating the resin composition (A) and the resin composition (B) in a molten state; and extruding the laminated resin compositions through a die.

(8) The method for manufacturing a stretched laminated film for use in piezoelectric polymer materials according to (7), further comprising steps of: stretching at least uniaxially the film by a draw ratio of 1.1 to 10 after extruding through the die and thermally treating at a temperature below the melting points of the poly-L-lactic acid and the poly-D-lactic acid.

Advantageous Effects of Invention

According to the present invention, there is provided a polylactic acid laminated film for use in piezoelectric polymer materials which is not prone to delamination while having excellent piezoelectric properties.

BRIEF DESCRIPTION OF DRAWINGS

FIG. 1 is a schematic depiction showing the evaluation method of the peel test in the present invention.

REFERENCE SIGNS LIST

1. Stretched laminated film for use in piezoelectric polymer materials
2. Double-sided adhesive tape
3. Stainless steel plate
4. Direction of removal

DESCRIPTION OF EMBODIMENTS

Stretched Laminated Film

The stretched laminated film of the present invention comprises a layer (A) containing a poly-L-lactic acid component as the primary constituent component and a layer (B) containing a poly-D-lactic acid component as the primary constituent component. Hereinafter, the poly-L-lactic acid component and the poly-D-lactic acid component are sometimes collectively referred to as polylactic acid components. It should be noted that "primary" herein denotes that the amount of the polylactic acid component contained in each layer is 60 mass % or more, preferably 75 mass % or more, more preferably 90 mass % or more, and particularly preferably 95 mass % or more, relative to the mass of each layer.

In the present invention, the laminated film may contain other layers so long as they do not impair the objectives of the present invention, provided that the film at least contains a layer (A) and a layer (B). Specifically, the film may have such other layer(s) between the layer (A) and the layer (B) or on the outer surface side of the layer (A) or the layer (B). Preferred in the present invention is an embodiment in which the layer (A) and the layer (B) are in contact with each other, and the effect of increasing the amount of displacement can be enhanced by employing this aspect.

Properties of the Laminated Film

Piezoelectric Properties

The stretched laminated film of the present invention is a piezoelectric polymer material which produces electric charges in both layers upon the elongation of the layer (A) on one side and the contraction of the layer (B) on the other side when the polymer material is bent. Thus, when determined by the measurement method described later, the piezoelectric constant $d_{31}$ becomes lower as the electric charges produced in the layer (A) and those produced in the layer (B) get closer to equal, because the electric charges produced in the layer (A) and those produced in the layer (B) cancel each other.

In the present invention, it is preferred that the piezoelectric constant $d_{31}$ as determined by the measurement method described later is less than 10 pC/N or lower. When the piezoelectric constant obtained is low, the piezoelectric property of producing electric charges through stretching is not detected, and it is possible to obtain a more efficient piezoelectric material for applications where electric charges are produced through bending because the piezoelectric mode can be limited. From this viewpoint, the piezoelectric constant $d_{31}$ is more preferably 7 pC/N or lower, even more preferably 5 pC/N or lower, and particularly preferably 1 pC/N or lower.

The layer (A) and the layer (B) in the present invention can be laminated by a co-extrusion process to achieve such piezoelectric properties. By laminating these layers by a co-extrusion process, it is possible to enhance the alignment of the principal orientation directions of the layer (A) and the layer (B), thereby obtaining the electric charges produced equal. To make the electric charges produced in the layer (A) equal to those produced in the layer (B), i.e., to reduce the piezoelectric constant as determined by the measurement method described later, further adjustments can be made as appropriate to make thickness, orientation embodiment, crystallinity, density, etc. equal between the layers.

In addition, it is preferred that the stretched laminated film of the present invention has an output voltage as measured as described later of 1 mVp-p or more. When an output voltage is large, it is possible to obtain a piezoelectric material that is efficient in the case of applications where electric charges are generated through bending. From this viewpoint, the output voltage is more preferably 5 mVp-p or more, even more preferably 10 mVp-p or more, and particularly preferably 20 mVp-p or more.

Density

It is preferred that the stretched laminated film of the present invention has a density of 1.22 to 1.27 g/cm³. A density equal to or higher than the above lower limit makes it possible to enlarge the effect of enhancing piezoelectric properties, while a density equal to or lower than the upper limit makes it easy to suppress delamination. From such viewpoints, the density is more preferably 1.22 to 1.26 g/cm³ and even more preferably 1.23 to 1.25 g/cm³.

Thickness

Since the stretched laminated film of the present invention becomes prone to delamination when too thick, the thickness is preferably 250 µm or less, more preferably 200 µm or less, particularly preferably 100 µm or less, and most preferably 70 µm or less. A thickness falling within the above numerical range makes it possible to enlarge the effect of enhancing piezoelectric properties while suppressing better delamination. From the viewpoint of piezoelectric properties, a thinner film is preferred. However, when the film is too thin, its rigidity is lost, so that the elongation or contraction of each layer upon bending does not occur. Thus, from the viewpoints of handling and rigidity, a thicker film is preferred; for example, the thickness is preferably 5 µm or more, more preferably 10 µm or more, even more preferably 12 µm or more, and particularly preferably 15 µm or more.

The constituent components constituting the laminated film of the present invention will be described below.

Polylactic Acids

It is preferred that the polylactic acids in the present invention are the L- or D-form of polylactic acid having an optical purity of 80 mole % or more. At an optical purity below the lower limit, the piezoelectric properties are low, so that the effects of the present invention are difficult to be produced. The preferred optical purity of polylactic acids is 90 mole % or more, even 95 mole % or more, and particularly 98 mole % or more. From that viewpoint, the polylactic acids are poly-L-lactic acid essentially consisting of L-lactic acid units only (hereinafter sometimes abbreviated as PLLA) or poly-D-lactic acid essentially consisting of D-lactic acid units only (hereinafter sometimes abbreviated as PDLA), or copolymers of the PLLA or PDLA with other monomers, or the like, and it is particularly preferred that they are poly-L-lactic acid essentially consisting of L-lactic acid units only and poly-D-lactic acid essentially consisting of D-lactic acid units only. From such a point of view, the content of the units other than L-lactic acid units in poly-L-lactic acid and the content of the units other than D-lactic acid units in poly-D-lactic acid are each preferably 0 to 10 mole %, more preferably 0 to 5 mole %, or even more preferably 0 to 2 mole %.

As specific copolymerization components, one or more monomers can be selected from, but are not particularly limited to, for example, hydroxycarboxylic acids such as glycolic acid, caprolactone, butyrolactone, propiolactone, etc., aliphatic diols having 2 to 30 carbon atoms such as ethylene glycol, 1,3-propanediol, 1,2-propanediol, 1,4-propanediol, 1,5-propanediol, hexanediol, octanediol, decanediol, dodecanediol, etc., aliphatic dicarboxylic acids having 2 to 30 carbon atoms such as succinic acid, maleic acid, adipic acid, etc., terephthalic acid, isophthalic acid, hydroxybenzoic acid, aromatic diols such as hydroquinone etc., aromatic dicarboxylic acids, and the like.

The melting points of such polylactic acids are preferably at least 150° C. and up to 190° C., and more preferably at least 160° C. and up to 190° C. A film according to this embodiment has excellent heat resistance. Further, the molecular weight of such polylactic acid is preferably a weight average molecular weight (Mw) in the range of 80,000 to 250,000, more preferably from 100,000 up to 250,000, and particularly preferably in the range of 120,000 to 200,000. A weight average molecular weight Mw falling within the above numerical range improves film thickness unevenness and makes it easier to suppress post-pressure-bonding delamination.

Impact Modifier

One of the features of the present invention lies in incorporating an impact modifier in a stretched laminated film for use in piezoelectric materials which is made of polylactic acids as described above, in the range of 0.1 to 10 mass % based on the mass of each of the layer (A) and the layer (B).

The impact modifier in the present invention may be any impact modifier without any particular limitation, so long as it can be used to improve the impact resistance of polylactic acids, and refers to plasticizers and to gum rubbers which show rubber elasticity at room temperature, including, for example, the various impact modifiers described below and the like.

Specific impact modifiers can include acrylic thermoplastic elastomers, fatty acid esters, soft aliphatic polyesters, ethylene-propylene copolymers, ethylene-propylene-non-conjugated diene copolymers, ethylene-butene-1 copolymers, ethylene-acrylic acid copolymers and the alkali metal salts thereof (so-called ionomers), ethylene-glycidyl(meth)acrylate copolymers, ethylene-(meth)acrylic acid alkyl ester copolymers (e.g., ethylene-methyl acrylate copolymers, ethylene-ethyl acrylate copolymers, ethylene-butyl acrylate copolymers, ethylene-methyl methacrylate copolymers), ethylene-vinyl acetate copolymers, acid-modified ethylene-propylene copolymers, diene rubbers (e.g., polybutadiene, polyisoprene, polychloroprene), copolymers of diene and vinyl monomers and the hydrogenation products thereof (e.g., styrene-butadiene random copolymers, styrene-butadiene block copolymers, styrene-butadiene-styrene block copolymers, styrene-isoprene random copolymers, styrene-isoprene block copolymers, styrene-isoprene-styrene block copolymers, styrene-ethylene-butylene-styrene block copolymers, styrene-ethylene-propylene-styrene block copolymers, polybutadiene graft copolymerized with styrene, butadiene-acrylonitrile copolymers), polyisobutylene, copolymers of isobutylene and butadiene or isoprene, natural rubbers, Thiokol rubbers, polysulfide rubbers, acrylic rubbers, silicone rubbers, polyurethane rubbers, polyether rubbers, epichlorohydrin rubbers, polyester-based elastomers or polyamide-based elastomers, etc., among which preferred is at least one selected from the group consisting of acrylic thermoplastic elastomers, fatty acid esters, and soft aliphatic polyesters.

Furthermore, those with various degrees of crosslinking, those having various microstructures such as cis structure, trans structure, etc., polymers having multilayered structure comprised of a core layer and one or more shell layers thereover, and the like can also be used.

Also, any random copolymer, block copolymer, graft copolymer, or the like of the various (co)polymers mentioned above as specific examples of impact modifiers can be used in the present invention. Furthermore, in the production of these (co)polymers, other monomers such as olefins, dienes, aromatic vinyl compounds, acrylic acid, acrylic acid esters, or methacrylic acid esters may also be copolymerized.

Among these impact modifiers, commercially available polymers having multilayered structure can include, for example, those manufactured by Mitsubishi Rayon under the trade name "Metablen," those manufactured by Kaneka under the trade name "Kane Ace," those manufactured by Rohm and Haas under the trade name "Paraloid," those manufactured by GANZ Chemical under the trade name "Staphyloid," that manufactured by Kuraray under the trade name "Paraface," or the like, and these can be used alone or in any combination of two or more thereof. As their manufacturing methods, known methods can be employed, among which emulsion polymerization methods are more preferred. For example, a manufacturing method of a polymer having multilayered structure is as follows: a desired monomer mixture is first emulsion polymerized to form a core particle, and then another monomer mixture is emulsion polymerized in the presence of the core particle to form a core-shell particle having a shell layer formed around the core particle; in addition, another monomer mixture is emulsion polymerized in the presence of the particle to form a core-shell particle having another shell layer formed on the particle; and such reaction is repeated to obtain a polymer having multilayered structure comprised of a desired core layer and one or more shell layers thereover. The polymerization temperature to form the (co)polymer of each layer is preferably 0 to 120° C., and more preferably 5 to 90° C., for each layer.

In view of the effects of the present invention, the polymers having multilayered structure used in the present invention are more preferably those comprising constituent components with glass transition temperatures of 0° C. or lower, even more preferably those comprising constituent components with glass transition temperatures of −30° C. or lower, and particularly preferably those comprising constituent components with glass transition temperatures of −40° C. or lower. It should be noted that the glass transition temperatures stated above refer herein to values determined with a differential scanning calorimeter at a heating rate of 20° C./min.

The average primary particle diameter of the polymer having multilayered structure is not particularly limited in the present invention, but, in view of the effects of the present invention, it is preferably 10 to 10000 nm, more preferably 20 to 1000 nm, particularly preferably 50 to 700 nm, and most preferably 100 to 500 nm.

Now, acrylic thermoplastic elastomers, fatty acid esters, and soft aliphatic polyesters, which are preferred impact modifiers in the present invention, will be individually described in detail below.

Firstly, examples of acrylic thermoplastic elastomers include acrylic ABA-type triblock copolymers composed of acrylic acid esters and methacrylic acid esters. Acrylic ABA-type triblock copolymers are ABA-type triblock copolymers in which the A-block component or B-block component of the ABA is a methacrylic acid ester and the other B-block component or A-block component is an acrylic acid ester, and preferred are ABA-type triblock copolymers in which the A-block component is a methacrylic acid ester and the B-block component is an acrylic acid ester.

Examples of the above methacrylic acid ester of the A-block component can include, for example, one or a combination of two or more of methyl methacrylate, ethyl methacrylate, n-propyl methacrylate, isopropyl methacrylate, n-butyl methacrylate, isobutyl methacrylate, tert-butyl methacrylate, n-pentyl methacrylate, n-hexyl methacrylate, cyclohexyl methacrylate, n-heptyl methacrylate, n-octyl methacrylate, 2-ethylhexyl methacrylate, nonyl methacrylate, decyl methacrylate, dodecyl methacrylate, phenyl methacrylate, toluyl methacrylate, benzyl methacrylate, isobornyl methacrylate, 2-methoxyethyl methacrylate, 3-methoxybutyl methacrylate, 2-hydroxyethyl methacrylate, 2-hydroxypropyl methacrylate, stearyl methacrylate, glycidyl methacrylate, 2-aminoethyl methacrylate, γ-(methacryloyloxypropyl)trimethoxysilane, γ-(methacryloyloxypropyl)dimethoxymethylsilane, ethylene oxide adducts of methacrylic acid, trifluoromethylmethyl methacrylate, 2-trifluoromethylethyl methacrylate, 2-perfluoroethylethyl methacrylate, 2-perfluoroethyl-2-perfluorobutylethyl methacrylate, 2-perfluoroethyl methacrylate, perfluoromethyl methacrylate, diperfluoromethylmethyl methacrylate, 2-perfluoromethyl-2-perfluoroethylmethyl methacrylate, 2-perfluorohexylethyl methacrylate, 2-perfluorodecylethyl methacrylate, 2-perfluorohexadecylethyl methacrylate, and the like, among which preferred are methyl methacrylate and dodecyl methacrylate, and particularly preferred is methyl methacrylate.

On the other hand, examples of the above acrylic acid ester of the B-block component can include, for example, one or a combination of two or more of methyl acrylate, ethyl acrylate, n-propyl acrylate, isopropyl acrylate, n-butyl acrylate, isobutyl acrylate, tert-butyl acrylate, n-pentyl acrylate, n-hexyl acrylate, cyclohexyl acrylate, n-heptyl acrylate, n-octyl acrylate, 2-ethylhexyl acrylate, nonyl acrylate, decyl acrylate, dodecyl acrylate, phenyl acrylate, toluyl acrylate, benzyl acrylate, isobornyl acrylate, 2-methoxyethyl acrylate, 3-methoxybutyl acrylate, 2-hydroxyethyl acrylate, 2-hydroxypropyl acrylate, stearyl acrylate, glycidyl acrylate, 2-aminoethyl acrylate, γ-(acryloyloxypropyl)trimethoxysilane, γ-(acryloyloxypropyl)dimethoxymethylsilane, ethylene oxide adducts of acrylic acid, trifluoromethylmethyl acrylate, 2-trifluoromethylethyl acrylate, 2-perfluoroethylethyl acrylate, 2-perfluoroethyl-2-perfluorobutylethyl acrylate, 2-perfluoroethyl acrylate, perfluoromethyl acrylate, diperfluoromethylmethyl acrylate, 2-perfluoromethyl-2-perfluoroethylmethyl acrylate, 2-perfluorohexylethyl acrylate, 2-perfluorodecylethyl acrylate, 2-perfluorohexadecylethyl acrylate, and the like, among which preferred are methyl acrylate and n-butyl acrylate.

Among the above, preferred are ABA-type triblock copolymers of a combination of poly(methyl methacrylate) and poly(n-butyl acrylate), among which preferred are ABA-type triblock copolymers of a combination of a polymethacrylic acid ester with a glass transition temperature (Tg) of 100 to 120° C. and a polyacrylic acid ester with a glass transition temperature (Tg) of −40 to −50° C.

Commercially available acrylic ABA-type triblock copolymers, which are among acrylic thermoplastic elastomers, include those manufactured by Kuraray under the trade name "Kurarity." These acrylic thermoplastic elastomers may be used individually alone or in any mixture of two or more thereof.

Secondly, examples of fatty acid esters include polyglycerol fatty acid esters. A polyglycerol fatty acid ester is an ester obtained by reacting a polyglycerol with a fatty acid. Examples of a polyglycerol, which is one constituent component of a polyglycerol fatty acid ester, include, for example, diglycerol, triglycerol, tetraglycerol, pentaglycerol, hexaglycerol, heptaglycerol, octaglycerol, nonaglycerol, decaglycerol, dodecaglycerol, and the like. These are used individually alone or in any mixture of two or more thereof. The average degree of polymerization of the polyglycerol is preferably 2 to 10.

As a fatty acid, which is the other constituent component of a polyglycerol fatty acid ester, a fatty acid having 12 or more carbon atoms, for example, is used. Specific examples of the fatty acid include lauric acid, myristic acid, palmitic acid, stearic acid, oleic acid, linoleic acid, linolenic acid, eicosadienoic acid, arachidonic acid, behenic acid, erucic acid, ricinoleic acid, 12-hydroxystearic acid, hydrogenated castor oil fatty acid, and the like. These are used individually alone or in any mixture of two or more thereof. Commercially available polyglycerol fatty acid esters include, for example, the Chirabazol line of products of Taiyo Kagaku such as those under the trade names "Chirabazol VR-10," "Chirabazol VR-2," etc., and the like. These fatty acid esters may be used individually alone or in any mixture of two or more thereof.

Lastly, examples of soft aliphatic polyesters include aliphatic polyesters and aliphatic-aromatic copolyesters. Examples of the soft aliphatic polyesters (aliphatic polyesters, aliphatic-aromatic copolyesters) include: polyesters obtained from polyhydric alcohols, such as diols, and polycarboxylic acids, such as dicarboxylic acids, in which an aliphatic diol is at least used as a diol and an aliphatic dicarboxylic acid is at least used as a dicarboxylic acid; polymers of aliphatic hydroxycarboxylic acids having 4 or more carbon atoms; and the like. Examples of the above-mentioned aliphatic diol include, for example, aliphatic diols (including alicyclic diols) having 2 to 12 carbon atoms such as ethylene glycol, 1,2-propanediol, 1,3-propanediol, 2,2-dimethyl-1,3-propanediol, 1,2-butanediol, 1,4-butanediol, neopentyl glycol, 1,5-pentanediol, 1,6-hexanediol, cyclohexanediol, 1,3-cyclohexanedimethanol, 1,4-cyclohexanedimethanol, etc., and the like. Examples of the aliphatic dicarboxylic acid include, for example, saturated aliphatic dicarboxylic acids (including alicyclic dicarboxylic acids) having 2 to 12 carbon atoms such as succinic acid, malonic acid, glutaric acid, adipic acid, pimelic acid, suberic acid, azelaic acid, sebacic acid, dodecanedioic acid, 1,3-cyclohexanedicarboxylic acid, 1,4-cyclohexanedicarboxylic acid, etc., and the like. In the above-mentioned polyester in which an aliphatic diol is at least used as a diol component and an aliphatic dicarboxylic acid is at least used as a dicarboxylic acid component, the percentage of aliphatic diols of the total of the diol components is, for example, 80 wt % or more, preferably 90 wt % or more, and more preferably 95 wt % or more, and the balance may be aromatic diols and the like. In addition, in the above-mentioned polyester in which an aliphatic diol is at least used as a diol component and an aliphatic dicarboxylic acid is at least used as a dicarboxylic acid component, the percentage of aliphatic dicarboxylic acids of the total of the dicarboxylic acid components is, for example, 20 wt % or more, preferably 30 wt % or more, and more preferably 50 wt % or more, and the balance may be aromatic dicarboxylic acids (e.g., terephthalic acid etc.) and the like. Examples of the above-mentioned aliphatic hydroxycarboxylic acids having 4 or more carbon atoms include, for example, hydroxycarboxylic acids having 4 to 12 carbon atoms such as hydroxybutyric acid, hydroxyvaleric acid, hydroxypentanoic acid, hydroxyhexanoic acid, hydroxydecanoic acid, hydroxydodecanoic acid, etc., and the like.

Representative examples of soft aliphatic polyesters include polybutylene succinate, polybutylene succinate adipate, polyethylene succinate, polyethylene succinate adipate, polybutylene adipate terephthalate, polybutylene sebacate terephthalate, polyhydroxylalkanoate, and the like. As these soft aliphatic polyesters, commercially available products can also be used. For example, examples of polybutylene succinate include that manufactured by Mitsubishi Chemical under the trade name "GS Pla AZ91T"; examples of polybutylene succinate adipate include that manufactured by Mitsubishi Chemical under the trade name "GS Pla AD92W"; and examples of polybutylene adipate terephthalate include those manufactured by BASF Japan under the trade name "Ecoflex." These soft aliphatic polyesters may be used individually alone or in any mixture of two or more thereof.

In view of the effects of the present invention, the loading of the impact modifier in the present invention is preferably in the range of 0.1 to 10 mass % based on the mass of each layer of the laminated film. If it is below the lower limit, then the aforementioned effect of suppressing delamination becomes poor. On the other hand, if it is above the upper limit, then piezoelectric properties are diminished. From such viewpoints, the lower limit of the loading of the impact modifier is preferably 0.5 mass % or even 1 mass %, while the upper limit is preferably 9 mass % or even 8 mass %. It should be noted that the addition of such an impact modifier makes it possible to suppress delamination of the laminated film without deteriorating piezoelectric properties. The reason is unclear, but it is presumed that this is because it can provide flexibility without deteriorating the orientation of the laminated film obtained, and the components of the impact modifier present in each co-extruded layer enhance adhesion with polylactic acid resins and thereby suppress delamination.

In addition, in view of the effects of the present invention, the ratio of the impact modifier contents of the layer (A) to the layer (B) (layer (A)/layer (B)) is preferably in the range of 0.05 to 20. More preferably, it is in the range of 0.2 to 5, even more preferably 0.25 to 4, and particularly preferably in the range of 0.5 to 2.

Additives and the Like

Then, the laminated film of the present invention may contain additives or functional agents known per se to the extent that the effects of the present invention are not impaired; for example, hydrolysis inhibitors, lubricants, antioxidants, antistatic agents, colorants, pigments, fluorescent brighteners, plasticizers, crosslinking agents, ultraviolet absorbers, other resins, and the like can be added as required.

From the viewpoints of the stability upon film casting, of suppressing hydrolysis, and of suppressing weight average molecular weight reduction, it is preferred, for example, that the polylactic acids used in the present invention have a carboxyl group content of 10 equivalents/$10^6$ g or less; and, from these viewpoints, the carboxyl group content is more preferably 5 equivalents/$10^6$ g or less and particularly preferably 2 equivalents/$10^6$ g or less. To attain this embodiment, it is preferred to add a carboxyl group-capping agent. In addition to capping the terminal carboxyl groups of polyesters such as polylactic acids, a carboxyl group-capping agent can cap carboxyl groups produced from the decomposition reaction of polyesters or various additives and carboxyl groups of low molecular compounds such as lactic acid, formic acid, etc. to stabilize resins; therefore, it provides the advantage that the resin temperature during film formation can be raised to a temperature sufficient to suppress flow non-uniformity speckles.

As such a carboxyl group-capping agent, it is preferred to use at least one compound selected from carbodiimide compounds, epoxy compounds, oxazoline compounds, oxazine compounds, and isocyanate compounds, among which carbodiimide compounds are preferred. As specific carbodiimide, known compounds can be employed, among which the cyclic carbodiimide given in Japanese Unexamined Patent Application Publication No. 2011-225640 makes it possible to also suppress deterioration of the working environment etc.

In the resin constituting each layer, the amount of carboxyl group-capping agent used is preferably 0.01 to 10 parts by mass, and more preferably 0.03 to 5 parts by mass, per 100 parts by mass of the polylactic acid. In the present invention, capping reaction catalysts may also be used.

In addition, the laminated film of the present invention may contain a lubricant therein for the purpose of improving its winding processability and runnability. Preferred examples of such lubricants can include, for example, inorganic particles such as silica produced by a dry process, silica produced by a wet process, zeolite, calcium carbonate, calcium phosphate, kaolin, kaolinite, clay, talc, titanium oxide, alumina, zirconia, aluminum hydroxide, calcium oxide, graphite, carbon black, zinc oxide, silicon carbide, tin oxide, etc., and organic fine particles such as crosslinked acryl resin particles, crosslinked polystyrene resin particles, melamine resin particles, crosslinked silicone resin particles, etc. These lubricants are preferably fine particles having an average particle diameter of 0.001 to 5.0 μm and can be used alone or in any combination of two or more thereof. They can be added in the range of 0.01 to 1.0 mass %, and more preferably 0.1 to 0.5 mass %, relative to the mass of each of the layer (A) and the layer (B).

Now, a manufacturing method of the stretched laminated film of the present invention will be described.

Manufacturing Method of Polylactic Acids

The method of manufacturing poly-L-lactic acid and poly-D-lactic acid in the present invention is not particularly limited, and conventionally known methods can be suitably used. They are exemplified by, for example, a method in which L-lactic acid or D-lactic acid is directly subjected to dehydrocondensation, a method in which L- or D-lactic acid oligomers are subjected to solid-state polymerization, a method in which L- or D-lactic acid is once subjected to cyclodehydration to form a lactide, followed by melt ring-opening polymerization, and the like. Among others, polylactic acids obtained by a method of direct dehydrocondensation or by a method of melt ring-opening polymerization of lactides are preferred from the viewpoints of quality and production efficiency, wherein a method of melt ring-opening polymerization of lactides is particularly preferably selected.

The catalyst used in these manufacturing methods may be any catalyst without any particular limitation, so long as it can catalyze polymerization such that the resulting polylactic acid has the predetermined properties mentioned above, and catalysts known per se can be used as appropriate.

For the sake of the melt stability and wet heat stability of the film, it is preferred that the poly-L-lactic acid and poly-D-lactic acid obtained are subjected to removal of polymerization catalysts, or to deactivation or inactivation of the catalytic activity of polymerization catalysts using deactivators, which is performed by conventionally known methods.

In the case where deactivators are used, the amount of deactivators used can be 0.3 to 20 equivalents, more preferably 0.5 to 15 equivalents, even more preferably 0.5 to 10 equivalents, and particularly preferably 0.6 to 7 equivalents, per equivalent of the elemental metal of specific metal-containing catalysts. If the amount of deactivators used is too low, then the activity of catalyst metal cannot be reduced sufficiently; on the other hand, using deactivators in too high an amount is not preferred as it may cause decomposition of the resins.

Manufacturing Method of a Laminated Film

The laminated film of the present invention is manufactured by a so-called co-extrusion process in which a resin composition (A) for forming the layer (A) and a resin composition (B) for forming the layer (B) are melted in separate extruders, respectively, and the molten resins are laminated in an extruder or in a die and extruded. This manufacturing method allows layers of a laminated film, previously produced separately, to be produced under the same stretching conditions and is superior in productivity in that processing steps such as adhesion etc. are not needed.

A preferred method for manufacturing the laminated film of the present invention by a co-extrusion process will be described below.

Extrusion Step

To the polylactic acids obtained by the above-described method, an impact modifier is added and, if desired, the aforementioned carboxyl group-capping agent, lubricant, other additives, etc. are added; and the resin (L) having poly-L-lactic acid as the primary component, for the layer (L), and the resin (D) having poly-D-lactic acid as the primary component, for the layer (D), are each melted in extruders and then extruded together through a die onto a cooling drum. It should be noted that, in order to suppress decomposition upon melting, it is preferred that the resins to be fed to extruders are subjected to a drying process before fed to extruders so as to have a water content of about 100 ppm or less.

The resin temperature in the extruder is at a temperature at which the resin has sufficient fluidity, that is, melt extrusion is conducted at a temperature in the range of (Tm+20) to (Tm+50°) C., where Tm is the melting point of the resin (L), and preferably at a temperature at which the resin does not decompose; such a temperature is preferably 200 to 260° C., more preferably 205 to 240° C., and particularly preferably 210 to 235° C. At a temperature falling within the above temperature range, flow non-uniformity is less prone to occur.

Casting Step

After extruded through a die, a film is cast onto a cooling drum to obtain an unstretched film. In so doing, it is preferred to cool and solidify the film while attaching it closely enough to the cooling drum by applying electrostatic charges from an electrode according to an electrostatic adhesion method. At that time, a wire-shaped or knife-shaped electrode is suitably used as an electrode that applies electrostatic charges. The surface material of the electrode is preferably platinum, which can suppress adhesion of impurities sublimated from the film to the electrode surface. Adhesion of impurities can also be prevented by blowing a stream of hot air at or near the electrode to maintain the electrode temperature at 170 to 350° C. and by placing an exhaust nozzle over the electrode.

Stretching Step

The unstretched film obtained above is uniaxially stretched. Preferably, it is stretched at least uniaxially by a draw ratio of 1.1 to 10. The direction of draw is not particularly limited, but it is preferred to stretch the film in the film-forming direction, in the width-wise direction, or in the diagonal direction which makes a 45° angle with respect to each of the film-forming direction and the width-wise direction. In such stretching, the unstretched film is heated to a temperature at which it is stretchable, for example, a temperature of at least the glass transition temperature of the resin L (Tg) and up to (Tg+80°) C., and stretched.

The draw ratio in the principal orientation direction is preferably 3 or greater, more preferably 3.5 or greater, even more preferably 4.0 or greater, and particularly preferably 4.5 or greater. A draw ratio equal to or above the above-described lower limit makes it possible to enlarge the effect of increasing the amount of displacement. Besides, though not particularly limited, the upper limit of the draw ratio is preferably 10 or lower, even more preferably 8 or lower, and particularly preferably 7 or lower, in view of the film-forming properties. On the other hand, stretching of the direction orthogonal to the principal orientation direction does not need to be performed, but may be done to the extent that the aforementioned relation of breaking strength is satisfied. Where stretching is applied, the draw ratio is preferably 2.3 or lower, more preferably 1.8, and particularly preferably 1.5 or lower. In addition, it is preferred that the ratio of the draw ratio of the principal orientation direction to the draw ratio of the direction orthogonal thereto (principal orientation direction/orthogonal direction) is 2 or greater.

Thermal Treatment Step

It is preferred that the uniaxially oriented polylactic acid film obtained above is thermally treated. The thermal treatment is preferably conducted at a temperature below the melting point of polylactic acid (poly-L-lactic acid or poly-D-lactic acid) and more preferably at a temperature of at least (Tg+15) and up to (Tm−10°) C., and piezoelectric properties can be enhanced by conducting such treatment. When the thermal treatment temperature is low, the effect of enhancing piezoelectric properties tends to be small; on the other hand, when it is high, the film tends to have poor flatness and mechanical properties, and the effect of enhancing piezoelectric properties tends to be small. From these viewpoints, the thermal treatment temperature is more preferably at least (Tg+20) and up to (Tm−20°) C., particularly preferably at least (Tg+30) and up to (Tm−35°) C. The thermal treatment time is preferably 1 to 120 seconds and more preferably 2 to 60 seconds, which makes it possible to improve the effect of enhancing the piezoelectric properties.

It is also possible in the present invention to control thermal dimensional stability by conducting relaxation treatment in the thermal treatment step.

Use as Piezoelectric Polymer Material

The stretched laminated film for use in piezoelectric polymer materials of the present invention can be used as an actuator of which amount of displacement upon application of electric charges as described in Patent Document 6 is large. Besides, when used as a sensor, the piezoelectric polymer material prepared by using polylactic acids exhibits the property of being capable of detecting not only the press but also the strength of the pressure.

A specific sensor can have a configuration in which, on both surfaces of the stretched laminated film for use in piezoelectric polymer materials of the present invention, electrodes are each formed and wiring for detecting signals from the electrodes is attached. Patterning electrodes on both surfaces as in Japanese Unexamined Patent Application Publication No. 2013-214329 makes it possible to detect location information and pressing information at the same time. Examples of uses for such a sensor include touch panels, pressure sensors, vibration sensors, and the like.

EXAMPLES

The present invention will be further illustrated below by means of examples, which do not limit the present invention in any way. It should be noted that all the values in the examples were determined according to the following methods.

1. Refractive Index

For the stretched laminated film for use in piezoelectric polymer materials obtained in each example, a refractive index was determined using a laser refractive index measuring device manufactured by Metricon at a prism coupler (633 nm) wavelength. Laser light is irradiated through a prism onto a sample attached closely to the prism, and the prism is rotated to change the incident angle onto the sample. The light reflected from the sample surface was measured and the incident angle dependence of the light intensity was monitored to determine the refractive index corresponding to the critical angle.

It should be noted that the above measurement was made each in the surface direction of the film, and the direction having the highest refractive index was regarded as the principal orientation direction. It should be noted that this principal orientation direction is generally the direction in which the stretching is conducted at the highest draw ratio; since the film is stretched at the higher draw ratio in its width-wise direction in Example 1 described later, the width-wise direction is its principal orientation direction.

2. Density

The stretched laminated film for use in piezoelectric polymer materials obtained in each example was measured according to the JIS standard C2151.

3. Glass Transition Temperature (Tg) and Melting Point (Tm)

Ten mg of resin composition was encapsulated in an aluminum pan for measurement, mounted on a differential scanning calorimeter, heated from 25° C. to 210° C. at a rate of 10° C./min, and then kept at 210° C. for 3 minutes, after which the pan was taken out and immediately transferred onto ice for rapid cooling. It should be noted that a differential scanning calorimeter manufactured by TA instruments under the trade name: DSC Q100 was used as the differential scanning calorimeter. Then, the pan was again mounted on the differential scanning calorimeter and heated from 25° C. at a rate of 10° C./min to determine the glass transition temperature (Tg: ° C.) and the melting point (Tm: ° C.).

4. Peel Test

To obtain test pieces, the stretched laminated film for use in piezoelectric polymer materials obtained in each example was cut to a length of 10 cm and a width of 1 cm, such that the longitudinal direction coincided with the principal orientation direction (i.e., the direction of the stretching conducted at the highest draw ratio) of the film. Then, a double-sided adhesive tape (manufactured by Sekisui Chemical, trade name: Double Tack Tape #575) of the same size as the test specimen is applied onto a stainless steel flat plate with a length of 15 cm, a width of 5 cm, and a thickness of 1 mm, onto which the test piece (the above-mentioned laminated film) is then attached and secured with a rubber roller. Thereafter, the test piece is peeled off from the stainless steel flat plate at an angle of 30° together with the double-sided adhesive tape as shown in FIG. 1, and the state changes of the laminated film resulting from the peeling are observed. The test was conducted 15 times. It should be noted that peeling herein means peeling which occurs between the layer (A)-side surface and the layer (B)-side surface of the laminated film, and complete peeling means a state in which the film has been completely separated into two films along the surface of the films.

⊚: No delamination of the test piece in all 15 trials.

○: Partial or complete delamination was observed in the test piece in 1 to 3 out of the 15 trials.

Δ: Partial or complete delamination was observed in the test piece in 4 to 7 out of the 15 trials.

x: Partial or complete delamination was observed in the test piece in 8 to 11 out of the 15 trials.

xx: Partial or complete delamination was observed in the test piece in 12 or more out of the 15 trials.

5. Piezoelectric Constant d31 Determined by Forced Vibration Method

On both surfaces of the stretched laminated film for use in piezoelectric polymer materials, an electrode was formed by vapor deposition of aluminum with a thickness such that the surface resistance value was about 50 Ω/sq., and the film was cut into a 70 mm×30 mm sample. It should be noted that the sample was cut out such that the principal orientation direction was at an angle of 45° with respect to its longitudinal direction.

Then, an aluminum foil was attached onto both electrode surfaces of the cut out sample, each electrode was connected and attached to a piezoelectric property measuring device (manufactured by Agilent Technologies, trade name: Precision Impedance Analyzer 4294A), and admittance resonance measurement by a two-terminal method was performed. At that time, the piezoelectric laminate was placed such that it had a small contact area with the desktop surface, so that there could be no effect on resonance. It should be noted that the admittance resonance measurement was performed by measuring piezoelectric resonance waveforms in the equivalent circuit pattern E, and the piezoelectric modulus d31 (d31=k31 $\sqrt{(\epsilon/Y)}$, unit: pC/N) was calculated from the permittivity obtained £, elastic modulus Y, and electromechanical coupling factor k31 and regarded as the piezoelectric constant. It is believed that the lower the piezoelectric constant obtained, the greater the amount of output voltage that is generated in response to displacement upon bending, because a low piezoelectric constant indicates that the piezoelectric constants of the layer (A) and the layer (B) are well-balanced and the value of the output voltage of both layers are offset each other.

6. Output Voltage

On both surfaces of the stretched laminated film for use in piezoelectric polymer materials, an electrode was formed by vapor deposition of aluminum with a thickness such that the surface resistance value was about 50 Ω/sq., and the film was cut into a 10 mm×50 mm sample. It should be noted that the sample was cut out such that the principal orientation direction was at an angle of 45° with respect to the direction along its longitudinal direction.

Then, an aluminum foil was attached onto each electrode of the last 10 mm of one longitudinal end (end A) of the cut out sample. Then, the end A of the laminated film was clamped with a clamp. At that time, the laminated film was placed such that its layer (A) side at the top and its layer (B) side at the bottom and such that its surface direction was horizontal. Then, the sample was connected to a data logger for voltage measurement (manufactured by Keyence, trade name: Multi-Input Data Collection System NR-500), and an iron ball with a weight of 20 g was dropped onto the free end, the opposite end to the end A, from a position 5 cm above it. The absolute value of the first pulse wave peak detected was regarded as the output voltage value. A higher value of the output voltage obtained indicates that the film is more efficient as a piezoelectric material. It should be noted that the position of the end of the sample onto which an iron ball was dropped was supposed to be the point where the edge was in contact with an imaginary line that passed vertically through the center of the iron ball.

Reference Example 1: Synthesis of Poly-L-Lactic Acid (PLLA)

A vertical stirred tank (40 L) with a Fullzone impeller, equipped with a vacuum line, a nitrogen gas line, a catalyst addition line, an L-lactide solution addition line, and an alcohol initiator addition line, was purged with nitrogen. Subsequently, 30 kg of L-lactide, 0.90 kg (0.030 mole/kg) of stearyl alcohol, and 6.14 g ($5.05 \times 10^{-4}$ mole/kg) of tin octylate were charged thereto and the mixture was heated to 150° C. in an atmosphere of a nitrogen pressure of 106.4 kPa. After the contents were dissolved, stirring was started, and the internal temperature was further raised to 190° C. Since the reaction starts when the internal temperature exceeds 180° C., the internal temperature was kept at 185 to 190° C. by cooling, and the reaction was allowed to continue for one hour. With stirring, the reaction was further carried out for one hour at a nitrogen pressure of 106.4 kPa and an internal temperature of 200 to 210° C., after which stirring was stopped, and a phosphorous catalyst deactivator was added.

Further, the resultant was allowed to stand for 20 minutes to remove gas bubbles, and then the internal pressure was increased to 2 to 3 atm by nitrogen pressure to extrude the prepolymer into a chip cutter, by which the prepolymer, having a weight average molecular weight of 130,000 and a molecular weight distribution of 1.8, was pelletized.

Further, the pellets were melted in an extruder, charged at 15 kg/hr into a shaftless basket-type reactor, subjected to a residual lactide reduction treatment under a reduced pressure of 10.13 kPa, and chipped again. The poly-L-lactic acid (PLLA) obtained had a glass transition temperature (Tg) of 55° C., a melting point (Tm) of 175° C., a weight average molecular weight of 120,000, a molecular weight distribution of 1.8, and a lactide content of 0.005 mass %.

Reference Example 2: Synthesis of Poly-D-Lactic Acid (PDLA)

In addition, in the same way as that in Reference Example 1 with the exception that D-lactide was used instead of L-lactide, poly-D-lactic acid (PDLA) was obtained which had a glass transition temperature (Tg) of 55° C., a melting point (Tm) of 175° C., a weigh average molecular weight of 120,000, a molecular weight distribution of 1.8, and a lactide content of 0.005 mass %.

Example 1

After each of the PLLA obtained in Reference Example 1 and the PDLA obtained in Reference Example 2 was thoroughly dried in a dryer, core-shell structures manufactured by Rohm and Haas Japan Co., Ltd. (Paraloid™ BPM-500) were added to each resin composition to a content of 5 mass %, which was then charged into a separate extruder. Then, the resins were molten at 220° C. and extruded through a die to be formed into a laminated sheet, and the sheet was cooled and solidified on a cooling drum with a surface temperature of 20° C. to obtain an unstretched film.

The unstretched film obtained was guided to a cluster of rollers heated to 75° C., stretched in the lengthwise direction by a draw ratio of 1.1, and cooled on a cluster of rollers at 25° C. Subsequently, the lengthwise stretched film was guided to a tenter with both film edges held by clips, and stretched in the width-wise direction by the draw ratio of 4.0 in an atmosphere heated to 75° C. Thereafter, the film was thermally treated for 30 seconds in the tenter under a temperature condition of 110° C. and uniformly and gradually cooled to room temperature to obtain a 50 μm-thick stretched laminated film made of polylactic acids.

Properties of the stretched laminated films obtained and piezoelectric polymer materials employing them are shown in Table 1.

Examples 2 to 12 and Comparative Examples 1 to 4

The same process as that in Example 1 was repeated, except that the kind and amount of the impact modifier contained were changed as shown in Table 1 and the thickness of each layer of the stretched laminated film obtained was changed as shown in Table 1.

Properties of the stretched laminated films obtained and piezoelectric polymer materials employing them are shown in Table 1.

It should be noted that, in Table 1, regarding impact modifiers, A refers to core-shell structures manufactured by Rohm and Haas Japan Co., Ltd. (trade name: Paraloid™ BPM-500), B refers to a thermoplastic elastomer manufactured by Kuraray Co., Ltd. (trade name: Kurarity LA2250), C refers to a fatty acid ester manufactured by Taiyo Kagaku Co., Ltd. (trade name: Chirabazol VR-8), and D refers to an An epoxy-based adhesive (manufactured by Huntsman Advanced Materials, trade name: Araldite Standard) was applied to the surface of the PLLA film obtained on the side that had been in contact with the cooling drum, and the PDLA film was superimposed thereon such that the principal orientation directions of the PLLA film and the PDLA film aligned with each other and such that the above adhesive was in contact with the surface of the PDLA film on the side that had not been in contact with the cooling drum. Thereafter, these films were made to closely adhere by using a handheld steel roller. It should be noted that the adhesive layer was 5 μm in thickness.

TABLE 1

| | Layer (A) | | | Layer (B) | | | Thickness | Impact Modifier Content | Peel Test | | | Piezo-electric | |
|---|---|---|---|---|---|---|---|---|---|---|---|---|---|
| | Primary Component Kind | Impact Modifier Kind | Content (mass %) | Primary Component Kind | Impact Modifier Kind | Content (mass %) | Total Thickness μm | Ratio Layer(A)/Layer(B) | Ratio Layer(A)/Layer (B) | (15 trials) — | Density g/cm³ | Constant d31 pC/N | Output Voltage mVp-p |
| Ex1 | PLLA | A | 5 | PDLA | A | 5 | 50 | 1:1 | 1 | ⊚ | 1.24 | 0.5 | 125 |
| Ex2 | PLLA | A | 8 | PDLA | A | 8 | 50 | 1:1 | 1 | ⊚ | 1.23 | 0.6 | 110 |
| Ex3 | PLLA | A | 0.5 | PDLA | A | 0.5 | 50 | 1:1 | 1 | ○ | 1.24 | 0.2 | 138 |
| Ex4 | PLLA | A | 2 | PDLA | A | 2 | 50 | 1:1 | 1 | ⊚ | 1.24 | 0.5 | 131 |
| Ex5 | PLLA | B | 5 | PDLA | B | 5 | 50 | 1:1 | 1 | ⊚ | 1.24 | 0.3 | 120 |
| Ex6 | PLLA | C | 5 | PDLA | C | 5 | 50 | 1:1 | 1 | ⊚ | 1.24 | 0.3 | 119 |
| Ex7 | PLLA | D | 5 | PDLA | D | 5 | 50 | 1:1 | 1 | ⊚ | 1.24 | 0.3 | 123 |
| Ex8 | PLLA | A | 5 | PDLA | A | 5 | 15 | 1:1 | 1 | ⊚ | 1.24 | 0.4 | 55 |
| EX9 | PLLA | A | 5 | PDLA | A | 5 | 80 | 1:1 | 1 | ○ | 1.24 | 0.5 | 155 |
| EX10 | PLLA | A | 5 | PDLA | A | 5 | 150 | 1:1 | 1 | Δ | 1.24 | 0.8 | 196 |
| Ex11 | PLLA | A | 5 | PDLA | A | 3 | 50 | 1:1 | 1.6 | ⊚ | 1.24 | 1.2 | 100 |
| Ex12 | PLLA | A | 5 | PDLA | A | 5 | 50 | 3:1 | 3 | ⊚ | 1.24 | 2.2 | 104 |
| Ex13 | PLLA | A | 5 | PDLA | A | 5 | 50 | 1:1 | 1 | ⊚ | 1.24 | 0.5 | 120 |
| CEx1 | PLLA | A | 0 | PDLA | A | 0 | 50 | 1:1 | — | XX | 1.25 | 0.1 | 140 |
| CEx2 | PLLA | A | 0 | PDLA | A | 5 | 50 | 1:1 | — | X | 1.24 | 1.0 | 105 |
| CEx3 | PLLA | A | 5 | PDLA | A | 0 | 50 | 1:1 | — | X | 1.24 | 1.0 | 104 |
| CEx4 | PLLA | A | 13 | PDLA | A | 13 | 50 | 1:1 | 1 | ⊚ | 1.22 | 0.6 | 85 |
| CEx5 | PLLA | A | 0 | PDLA | A | 0 | 50 | 1:1 | — | ○ | 1.25 | — | 80 | aliphatic-aromatic random copolyester manufactured by BASF Japan (trade name: Ecoflex).

Example 13

The same process as that in Example 1 was repeated, except that the cyclic carbodiimide given in Reference Example 4 in Japanese Unexamined Patent Application Publication No. 2011-225640 was incorporated in each of the polylactic acids of the layer (A) and the layer (B) in an amount of 1 mass % based on the mass of each layer.

Properties of the stretched laminated films obtained and piezoelectric polymer materials employing them are shown in Table 1.

Comparative Example 5

The PLLA obtained in Reference Example 1 was thoroughly dried in a dryer, charged into an extruder, melted at 220° C., and extruded through a die to be formed into a sheet, and the sheet was cooled and solidified on a cooling drum with a surface temperature of 20° C. to obtain an unstretched film. Using the unstretched film obtained, the same process as that in Example 1 was conducted to obtain a PLLA film having 25 μm thickness. In addition, using the PDLA obtained in Reference Example 2, the same process as that for the above PLLA was conducted to obtain a PDLA film having 25 μm thickness.

In Table 1, PLLA refers to poly-L-lactic acid, and PDLA refers to poly-D-lactic acid. Regarding impact modifiers, A refers to core-shell structures manufactured by Rohm and Haas Japan Co., Ltd. (trade name: Paraloid™ BPM-500), B refers to a thermoplastic elastomer manufactured by Kuraray Co., Ltd. (trade name: Kurarity LA2250), C refers to a fatty acid ester manufactured by Taiyo Kagaku Co., Ltd. (trade name: Chirabazol VR-8), and D refers to an aliphatic-aromatic random copolyester manufactured by BASF Japan (trade name: Ecoflex).

INDUSTRIAL APPLICABILITY

According to the present invention, there can be provided a laminated film for use in piezoelectric polymer materials with excellent piezoelectric properties and with its delamination suppressed, which can be used as switches, touch panels, pressure sensors, vibration sensors, and for vibration power generation.

The invention claimed is:
1. A stretched laminated film obtained by a co-extrusion process for use in piezoelectric polymer materials, comprising:
 a layer (A) containing poly-L-lactic acid as the primary component and further containing an impact modifier in the range of 0.1 to 10 mass % as an added component, and a layer (B) containing poly-D-lactic acid as the primary component and further containing an impact modifier in the range of 0.1 to 10 mass % as an added component,
wherein the film is a stretched film, and a ratio of the draw ratio in the principal orientation direction to the draw ratio in the direction orthogonal thereto (principal orientation direction/orthogonal direction) is 2 or greater,
wherein the draw ratio in the orthogonal direction is 1.8 or lower,
wherein the film has a piezoelectric property.

2. The stretched laminated film for use in piezoelectric polymer materials according to claim 1, wherein the stretched laminated film has a piezoelectric constant d31 of less than 10 pC/N as determined by a forced vibration method.

3. The stretched laminated film for use in piezoelectric polymer materials according to claim 1, wherein the ratio of the impact modifier contents of the layer (A) to the layer (B) (layer (A)/layer (B)) is in the range of 0.05 to 20.

4. The stretched laminated film for use in piezoelectric polymer materials according to claim 1, wherein the stretched laminated film has a density of 1.22 to 1.27 $g/cm^3$.

5. The stretched laminated film for use in piezoelectric polymer materials according to claim 1, wherein the stretched laminated film has a thickness of 250 μm or less.

6. The stretched laminated film for use in piezoelectric polymer materials according to claim 1, wherein the stretched laminated film generates an output voltage of 1 mVp-p or more when displaced with one end fixed.

* * * * *